United States Patent
Nakamuta et al.

(10) Patent No.: US 8,536,911 B1
(45) Date of Patent: Sep. 17, 2013

(54) PLL CIRCUIT, METHOD OF CONTROLLING PLL CIRCUIT, AND DIGITAL CIRCUIT

(71) Applicant: Fujitsu Limited, Kawasaki (JP)

(72) Inventors: Koji Nakamuta, Yokohama (JP); Yoshito Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/736,665

(22) Filed: Jan. 8, 2013

(30) Foreign Application Priority Data

Mar. 19, 2012 (JP) ................ 2012-062895

(51) Int. Cl.
  *H03L 7/06* (2006.01)
(52) U.S. Cl.
  USPC .................. 327/156; 327/147
(58) Field of Classification Search
  USPC ................ 327/147, 156
  See application file for complete search history.

(56) References Cited

U.S. PATENT DOCUMENTS

| | | | |
|---|---|---|---|
| 7,064,621 B2 | 6/2006 | Nakanishi | |
| 7,124,153 B2 | 10/2006 | Grushin | |
| 7,511,762 B2 * | 3/2009 | Elnathan et al. | 348/500 |
| 2008/0055485 A1 * | 3/2008 | Elnathan et al. | 348/723 |
| 2008/0111597 A1 * | 5/2008 | Cranford et al. | 327/156 |
| 2008/0111633 A1 * | 5/2008 | Cranford et al. | 331/10 |

FOREIGN PATENT DOCUMENTS

| | | |
|---|---|---|
| JP | 3-021118 | 1/1991 |
| JP | 7-131492 | 5/1995 |
| JP | 9-326999 | 12/1997 |
| JP | 2001-044979 | 2/2001 |
| JP | 2001-513974 | 9/2001 |
| JP | 2002-198847 | 7/2002 |
| JP | 2005-064896 | 3/2005 |
| JP | 2006-333382 | 12/2006 |
| JP | 2009-153009 | 7/2009 |
| JP | 4377696 B2 | 12/2009 |
| WO | WO-99/33182 | 7/1999 |

* cited by examiner

*Primary Examiner* — Adam Houston
(74) *Attorney, Agent, or Firm* — Fujitsu Patent Center (57) ABSTRACT

A PLL circuit includes a digital PLL circuit and an analog PLL circuit, wherein the digital PLL circuit includes a first digital phase detector configured to detect a first phase difference between a reference clock signal and a first feedback clock signal, and a phase accumulator configured to generate, as the first feedback clock signal, a digital oscillating signal having oscillating frequency that changes in response to the detected first phase difference, and wherein the analog PLL circuit includes a second digital phase detector configured to detect a second phase difference between the digital oscillating signal generated by the phase accumulator and a second feedback clock signal, and a voltage controlled oscillator configured to receive a voltage value changing in response to the detected second phase difference and to generate the second feedback clock signal that oscillates at frequency responsive to the voltage value.

7 Claims, 12 Drawing Sheets

PLL CIRCUIT, METHOD OF CONTROLLING PLL CIRCUIT, AND DIGITAL CIRCUIT

CROSS-REFERENCE TO RELATED APPLICATIONS

The present application is based upon and claims the benefit of priority from the prior Japanese Patent Application No. 2012-062895 filed on Mar. 19, 2012, with the Japanese Patent Office, the entire contents of which are incorporated herein by reference.

FIELD

The disclosures herein generally relate to electronic circuits, and particularly relate to a PLL circuit.

BACKGROUND

The reference clock source situated at the top layer of a digital synchronous network generally uses a cesium atomic oscillator as a primary standard. Each transmission apparatus in the synchronous network is provided with a sync unit that generates a clock for use within the apparatus based on the clock signal distributed from the reference clock source.

A PLL (phase locked loop) frequency multiplier circuit provided in the sync unit is often required to perform frequency multiplication by a factor of one million so as to generate a frequency of several GHz from a frequency of several kHz. An attempt to construct such a circuit by use of a single stage PLL results in the frequency division ratio of the feedback clock being extremely large. This gives rise to a problem in that the frequency divider circuit becomes very large and also a problem in that a desired loop frequency band cannot be achieved due to a loop gain drop. In consideration of this, a two-stage PLL circuit is generally employed. A frequency is increased from several kHz to several MHz at the first stage, and is then increased from several MHz to several GHz at the second stage.

Such a two-stage PLL circuit generally has a configuration in which the two stages are both analog PLL circuits, or has a configuration in which the first PLL circuit is digital and the second PLL circuit is analog. Either configuration is required to have an increased accuracy in the first-stage PLL circuit in order to improve the overall accuracy. Mechanism for increasing the accuracy of the first-stage PLL circuit include a digital PLL circuit that employs a direct digital synthesizer (i.e., DDS), which is a circuit that generates an oscillating waveform having a frequency responsive to input digital data.

The digital PLL circuit includes a digital phase detector, a digital loop filter, and a DDS. The DDS generates a signal oscillating at frequency responsive to the value of an output signal of the digital loop filter, and the generated signal is supplied to the digital phase detector as a feedback clock. The digital phase detector detects a phase difference between every M-th pulse of the feedback clock and each pulse of the reference clock to produce a digital value indicative of the detected phase. The digital loop filter temporally integrates digital values indicative of phase differences. Through this integration, the digital value indicative of a phase difference at a given moment is weighted and added to the integrated value of previously detected phase differences, so that the oscillating frequency of the DDS is successively adjusted in response to the currently detected phase difference. Through this adjustment, the oscillating signal of the DDS is controlled such that every M-th pulse of the feedback clock and each pulse of the reference clock have no phase difference. As a result, the frequency ratio of the feedback clock to the reference clock is set to M to 1.

The DDS used in the above-described digital PLL circuit includes a phase accumulator, a waveform transforming unit, and a DA converter. The phase accumulator successively adds the output digital value of the digital loop filter to the current output value of the phase accumulator to produce an output. The register that stores an accumulated sum in the phase accumulator has a predetermined bit width. Upon exceeding the value that can be expressed by this bit width, the accumulated sum returns to a smaller value, which is the value obtained by subtracting the predetermined value plus one from the current accumulated sum. The waveform transforming unit is provided with a waveform table, and transforms a triangular digital signal generated through cumulative summation by the phase accumulator into a sinusoidal digital signal. The DA converter converts the sinusoidal digital signal into an analog signal. The sinusoidal analog signal is output from the DDS.

The output value of the phase accumulator of a DDS may be directly fed back into a digital phase detector for the purpose of improving the accuracy of the digital PLL circuit (see Patent Document 1, for example). In the two-stage PLL circuit in which the first-stage PLL circuit is digital and the second-stage PLL circuit is analog, however, an increase in the accuracy of the phase detector of the first-stage digital PLL circuit will not result in sufficiently high overall accuracy if the accuracy of the DA converter at the output of the DDS is low. In order to increase the overall accuracy of a two-stage PLL circuit, the accuracy of the DA converter at the output of the DDS may need to be increased. Achieving this goal, however, requires the use of a high-end expensive DA converter having a wide bit width, which results in an undesirable cost increase.

[Patent Document 1] Japanese Patent No. 4377696
[Patent Document 2] Japanese Laid-open Patent Publication No. 2001-044979
[Patent Document 3] Japanese Laid-open Patent Publication No. 2005-064896
[Patent Document 4] Japanese Laid-open Patent Publication No. 2006-333382
[Patent Document 5] Japanese Laid-open Patent Publication No. H03-021118
[Patent Document 6] Japanese National Publication of International Patent Application No. 2001-513974
[Patent Document 7] Japanese Laid-open Patent Publication No. H07-131492
[Patent Document 8] Japanese Laid-open Patent Publication No. 2002-198847
[Patent Document 9] Japanese Laid-open Patent Publication No. 2009-153009
[Patent Document 10] Japanese Laid-open Patent Publication No. H09-326999

SUMMARY

According to an aspect of the embodiment, a PLL circuit includes a digital PLL circuit and an analog PLL circuit, wherein the digital PLL circuit includes a first digital phase detector configured to detect a first phase difference between a reference clock signal and a first feedback clock signal, and a phase accumulator configured to generate, as the first feedback clock signal, a digital oscillating signal having oscillating frequency that changes in response to the detected first phase difference, and wherein the analog PLL circuit includes a second digital phase detector configured to detect a second phase difference between the digital oscillating signal generated by the phase accumulator and a second feedback clock signal, and a voltage controlled oscillator configured to receive a voltage value changing in response to the detected second phase difference and to generate the second feedback clock signal that oscillates at frequency responsive to the voltage value.

A method of controlling a two-stage PLL circuit in which an output of a digital PLL circuit is applied as an input to an analog PLL circuit includes the steps of utilizing a phase accumulator to generate a digital oscillating signal having oscillating frequency that changes in response to a phase difference detected by phase detection performed in the digital PLL circuit, utilizing the digital oscillating signal generated by the phase accumulator as a feedback clock signal used in the phase detection performed in the digital PLL circuit, and utilizing the digital oscillating signal generated by the phase accumulator as a reference clock signal used in phase detection performed in the analog PLL circuit.

A digital circuit includes a digital PLL circuit and a digital phase detector provided in a next-stage PLL circuit situated at a stage following the digital PLL circuit, wherein the digital PLL circuit includes a phase accumulator to generate a digital oscillating signal having oscillating frequency that changes in response to a phase difference detected by phase detection, and wherein the digital PLL circuit utilizes the digital oscillating signal generated by the phase accumulator as a feedback clock signal used in the phase detection performed in the digital PLL circuit, and also utilizes the digital oscillating signal generated by the phase accumulator as a reference clock signal used in phase detection performed by the digital phase detector.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the invention will be described with reference to the accompanying drawings.

Figure 1:
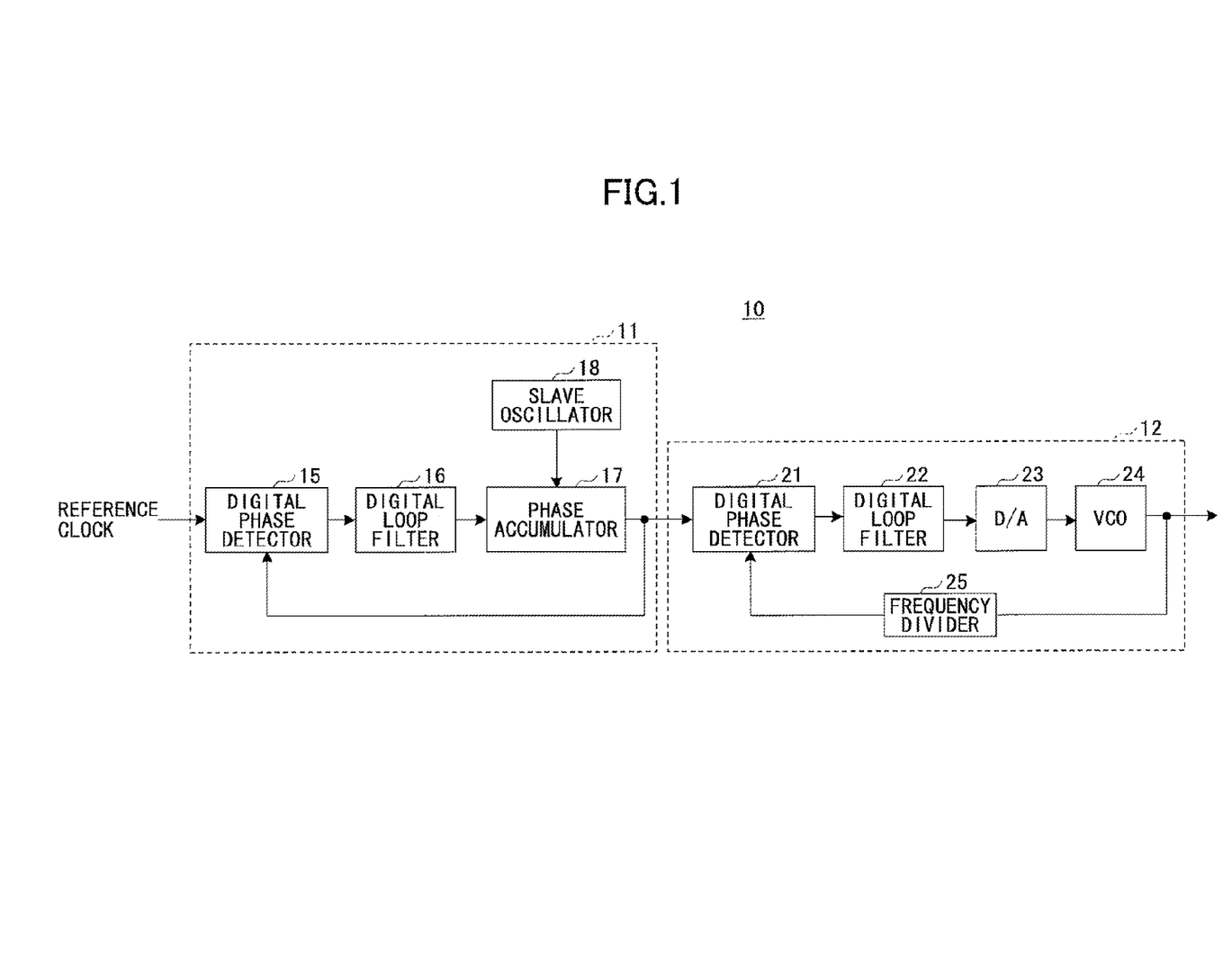
FIG. 1 is a drawing illustrating an example of the configuration of a two-stage PLL circuit.

FIG. 1 is a drawing illustrating an example of the configuration of a two-stage PLL circuit. A two-stage PLL circuit 10 illustrated in FIG. 1 includes a first-stage digital PLL circuit 11 and a second-stage analog PLL circuit 12. The digital PLL circuit 11 includes a digital phase detector 15, a digital loop filter 16, a phase accumulator 17, and a slave oscillator 18. The analog PLL circuit 12 includes a digital phase detector 21, a digital loop filter 22, a DA converter (D/A) 23, a voltage controlled oscillator (VCO) 24, and a frequency divider 25.

The digital phase detector 15 detects a phase difference (referred to as a first phase difference) between a reference clock signal and a first feedback clock signal. The first feedback clock signal is supplied from the phase accumulator 17 to the digital phase detector 15. The digital loop filter 16 temporally integrates digital values indicative of first phase differences output from the digital phase detector 15. The phase accumulator 17 receives, as an input, a value (i.e., the integrated value of phase differences) output from the digital loop filter 16 responsive to the first phase difference, and generates a signal oscillating at frequency responsive to this input value. In this manner, the phase accumulator 17 generates, as the first feedback clock, a digital oscillating signal having oscillating frequency that changes in response to the first phase difference. Namely, through integration by the digital loop filter 16, a digital value indicative of a first phase difference at a given moment is weighted and added to the integrated value of previous first phase differences. In this manner, the oscillating frequency of the phase accumulator 17 is successively adjusted in response to the currently detected first phase difference.

The digital phase detector 21 detects a phase difference (referred to as a second phase difference) between the digital oscillating signal generated by the phase accumulator 17 and a second feedback clock. The second feedback clock signal is supplied from the voltage controlled oscillator 24 to the digital phase detector 21 via the frequency divider 25. The digital loop filter 22 temporally integrates digital values indicative of second phase differences output from the digital phase detector 21. The DA converter 23 converts a value (i.e., the integrated value of phase differences) changing in response to the second phase difference output from the digital loop filter 22 into an analog voltage. The phase accumulator 24 receives, as an input, a voltage (i.e., the voltage indicative of the integrated value of phase differences) output from the DA converter 23 changing in response to the second phase difference, and generates a signal oscillating at frequency responsive to this voltage value. In this manner, the voltage controlled oscillator 24 generates, as the second feedback clock, a oscillating signal having oscillating frequency that changes in response to the second phase difference. Namely, through integration by the digital loop filter 22, a digital value indicative of a second phase difference at a given moment is weighted and added to the integrated value of previous second phase differences. In this manner, the oscillating frequency of the voltage controlled oscillator 24 is successively adjusted in response to the currently detected second phase difference. The second feedback clock signal generated by the voltage controlled oscillator 24 is supplied to the digital phase detector 21 after its frequency is divided by N at the frequency divider 25.

Figure 2:
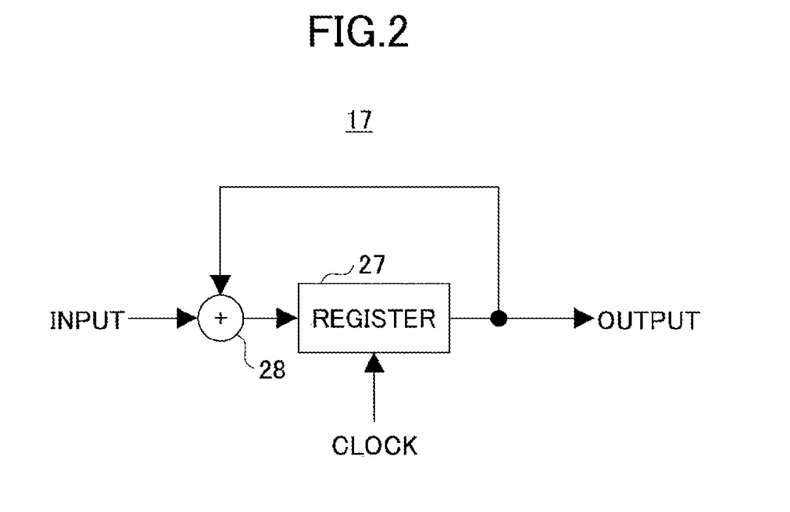
FIG. 2 is a drawing illustrating an example of the configuration of a phase accumulator.

FIG. 2 is a drawing illustrating an example of the configuration of the phase accumulator 17. The phase accumulator 17 includes a register 27 and an adder 28. The phase accumulator 17 receives as an input the digital output value of the digital loop filter 16, and adds this input value to the current-cycle output value of the phase accumulator 17 to produce a next-cycle output. Specifically, the value stored in the register 27 serves as the current-cycle output value of the phase accumulator 17, and this output value is added to the input value by the adder 28. The added value output from the adder 28 is stored in the register 27 at the next cycle in synchronization with a clock signal from the slave oscillator 18 (see FIG. 1), and will serve as the next-cycle output value of the phase accumulator 17. The register 27 that stores an accumulated sum has a predetermined bit width. Upon exceeding the value that can be expressed by this bit width, the accumulated sum returns to a smaller value, with the carry from the most significant bit being ignored. This smaller value is equal to the value obtained by subtracting a predetermined value from the accumulated sum.

Figure 3:
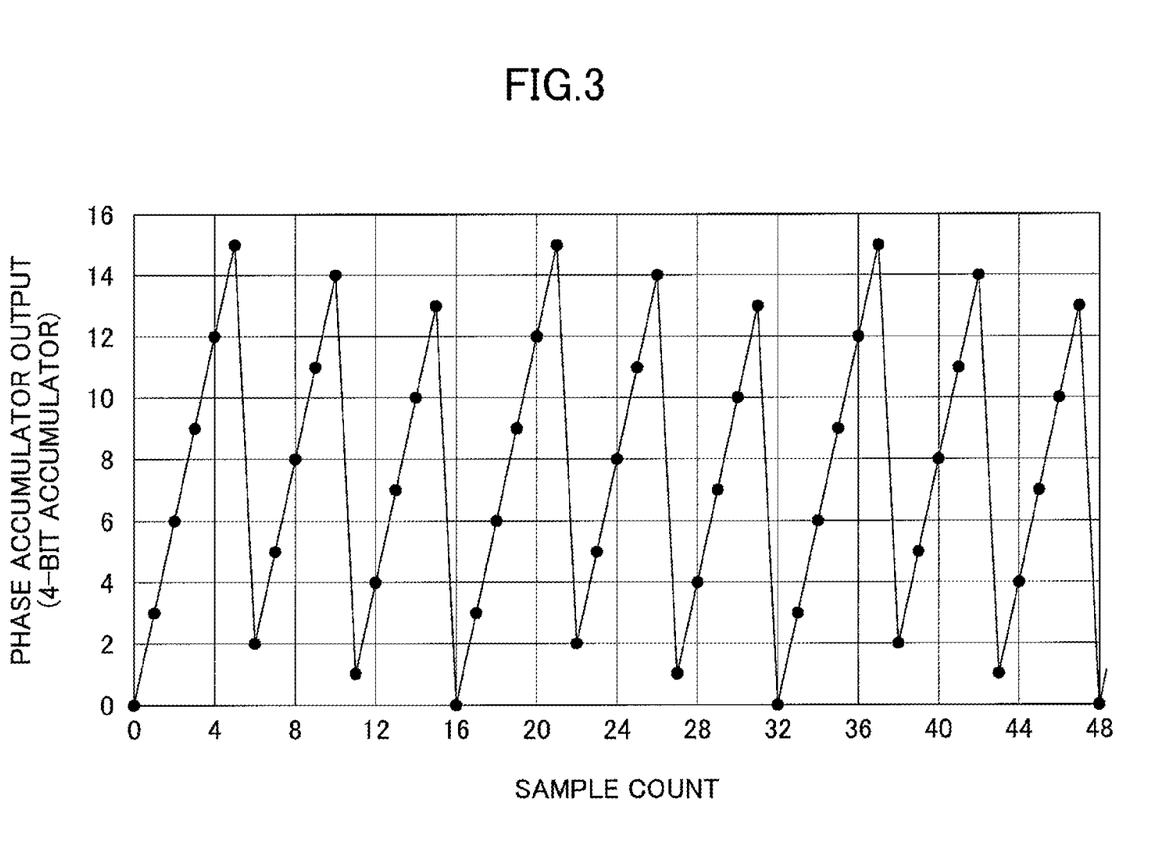
FIG. 3 is an illustrative drawing illustrating an example of the output of the phase accumulator.

FIG. 3 is an illustrative drawing illustrating an example of the output of the phase accumulator 17. For the sake of explanation, this example is directed to the case in which the bit width of the register 27 of the phase accumulator 17 is $2^4=16$, and the input into the phase accumulator 17 is 3. When starting with an initial value of zero, the value stored in the register 27, i.e., the output value of the phase accumulator 17, changes as follows: 0, 3, 6, 9, 12, 15, 2, 5, 8, . . . . Since the bit width of the register 27 is $2^4=16$, the value stored in the register 27 can only assume a value between 0 and 15. In the cycle following the cycle in which the output value is 15, the output value would become 18 if the bit width was not limited. In reality, however, the output value cannot exceed the maximum value "15" due to the limited bit width, and becomes 2=18−(15+1) in the next cycle. In this manner, the output value of the phase accumulator 17 is successively changed such that a value of the 4-bit width is stored in the register 27 while the carry from the most significant bit of the adder 28 is ignored. When a value input into the phase accumulator 17 is constant (as in this example in which the input value is 3), the output value of the phase accumulator 17 returns to its initial value (i.e., zero in this example) each time the sample count (i.e., the cycle count) indicated along the horizontal axis of FIG. 3 becomes $2^4=16$, which is a predetermined count derived from the 4-bit width. This is because a value obtained by multiplying the input value by $2^4$ (i.e., the predetermined sample count along the horizontal axis) is always divisible by $2^4$ (i.e., the vertical-axis maximum value "15" plus 1).

Accordingly, the cycle (i.e., sample count) at which the digital phase detector 15 detects a phase difference is preferably equal to an integer multiple of $2^N$ when the bit width of the phase accumulator 17 (i.e., the bit width of the register 27) is N (which is a natural number). Phase detection performed at such timing ensures that the output value of the phase accumulator 17 is always the same value when a value input into the phase accumulator 17 is constant. Namely, the phase of the oscillating signal of the phase accumulator 17 can be accurately reflected in the result of phase detection.

Figure 4:
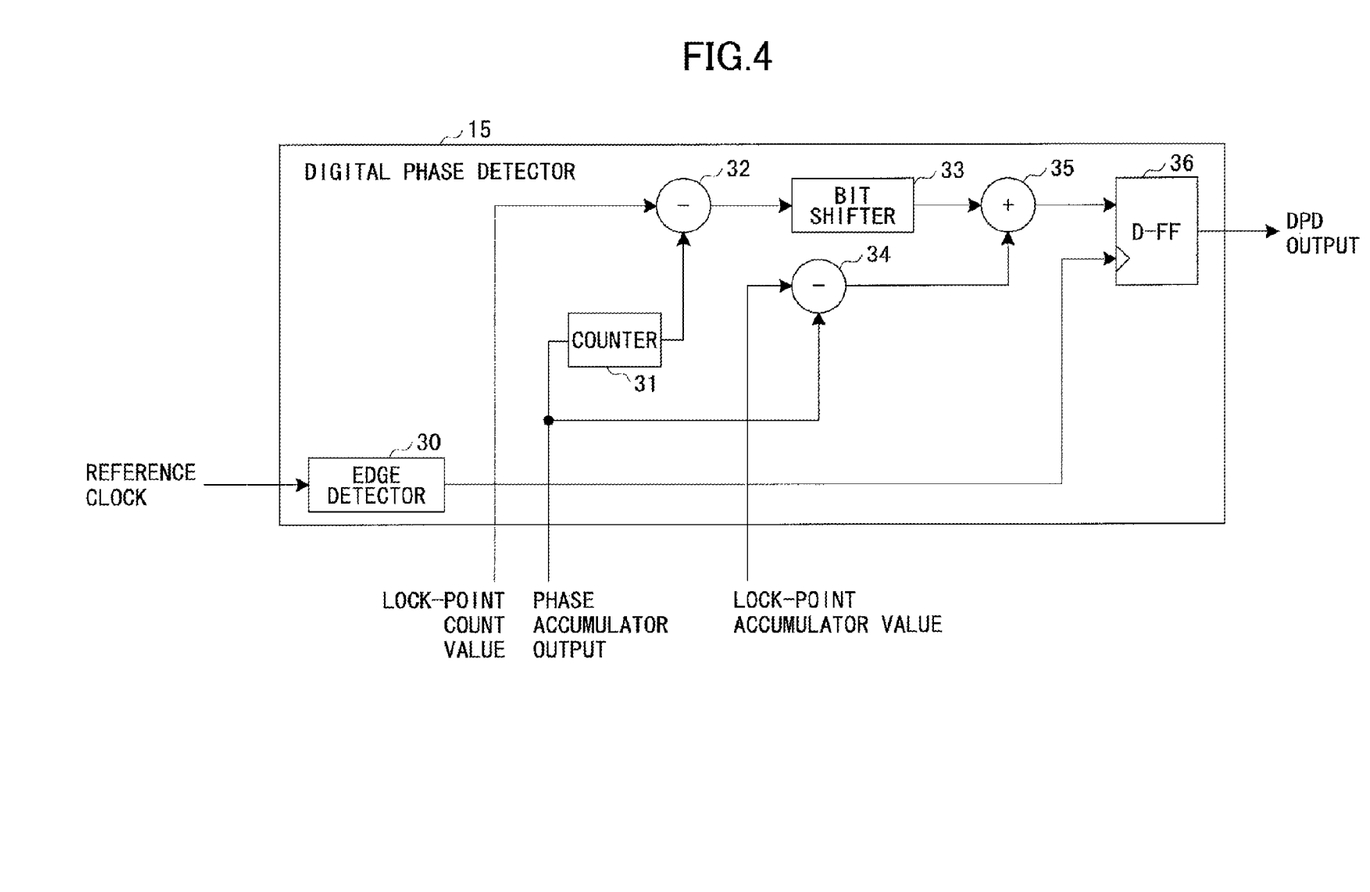
FIG. 4 is a drawing illustrating an example of the configuration of a digital phase detector.

FIG. 4 is a drawing illustrating an example of the configuration of the digital phase detector 15. The digital phase detector 15 illustrated in FIG. 4 includes an edge detector 30, a counter 31, a subtracter 32, a bit shifter 33, a subtracter 34, an adder 35, and a D flip-flop 36. The counter 31, the subtracter 32, the bit shifter 33, the subtracter 34, and the adder 35 together serve as an arithmetic unit, which calculates a value indicative of the phase position of an output of the phase accumulator 17 in response to the output value of the phase accumulator 17. Specifically, this arithmetic unit calculates a value that has, in its higher order bits, a value responsive to the value that increases with each cycle of the digital oscillating signal output from the phase accumulator 17, and has, in its lower order bits, a value responsive to the digital value of the digital oscillating signal. The D flip-flop 36 serves as a latch circuit, and stores the above-noted calculated value in synchronization with the reference clock.

Figure 5:
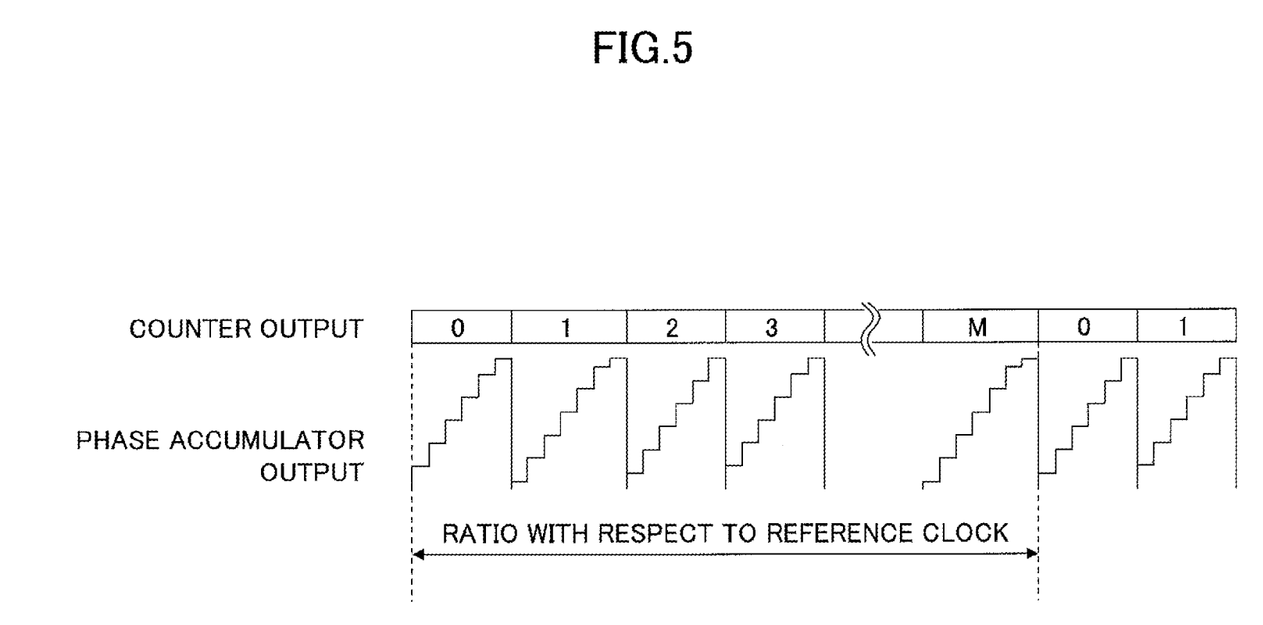
FIG. 5 is a drawing illustrating an example of the operation of a counter.

FIG. 5 is a drawing illustrating an example of the operation of the counter 31. The counter 31 counts up each time the output value of the phase accumulator 17 decreases, and is reset to zero in the cycle immediately following the cycle in which the count becomes a predetermined value M. This predetermined value M is equal to a value indicating the ratio of the first feedback clock to the reference clock wherein the first feedback clock signal is the digital oscillating signal output from the phase accumulator 17. As illustrated in FIG. 5, the output of the phase accumulator 17, which is a cumulative sum of the input into the phase accumulator 17, gradually increases through cumulative addition, and then decreases upon exceeding the maximum value ($2^N-1$) that can be expressed by the bit width. Each time the output value of the phase accumulator 17 decreases upon exceeding the maximum value ($2^N-1$), the output count value of the counter 31 increases by one. In this manner, the counter 31 generates a value that increases by one with each cycle of the digital oscillating signal output from the phase accumulator 17.

Referring to FIG. 4 again, the subtracter 32 subtracts a lock-point count value (referred to as a first predetermined value) from the output of the counter 31. The bit shifter 33 shifts to the left by N bits the value that is obtained by subtracting the lock-point count value from the output of the counter 31. A value obtained in this manner serves as the higher-order bits of the calculated value previously described. The subtracter 34 subtracts a lock-point accumulator value (referred to as a second predetermined value) from the digital oscillating signal output from the phase accumulator 17. A value obtained by the subtracter 34 serves as the lower-order bits (i.e., the N lower-order bits) of the calculated value previously described. The adder 35 adds the higher-order bits to the lower-order bits to obtain the above-noted calculated value. The edge detector 30 asserts its output upon detecting a rising edge of the reference clock signal. The D flip-flop 36 stores the calculated value from the adder 35 in response to the assertion of the output of the edge detector 30. Namely, the D flip-flop 36 loads the calculated value from the adder 35 in response to a rising edge of the reference clock signal. The value stored in the D flip-flop 36 serves as the output of the digital phase detector 15 (i.e., DPD output).

The higher-order bits of the above-noted calculated value indicate the cycle position (i.e., which cycle) of the output of the phase accumulator 17. The lower-order bits of the calculated value indicate the sample position of the output of the phase accumulator 17 within a given cycle. The calculated value stored in the D flip-flop 36 is a digital value that indicates the relative position of the reference clock with respect to the output of the phase accumulator 17. It may be noted that a lock point indicates the point at which a rising edge of a pulse of the reference clock signal is locked. When the lock-point count value is 300, for example, all the higher-order bits of the calculated value, i.e., the output value of the subtracter 32, become zero at the cycle position at which the output value of the counter 31 is 300. Further, all the lower-order bits of the calculated value become zero at some sample point within this cycle. The sample point at which all the higher-order bits and all the lower order bits of the calculated value become zero is the lock point. The calculated value changes from a negative value to a positive value upon crossing this lock point.

When a rising edge of the reference clock signal coincides with the lock point, the value stored in the D flip-flop 36, i.e., the output of the digital phase detector 15, is zero. In such a case, the output of the digital loop filter 16 illustrated in FIG.

1 does not change. Further, neither the input of the phase accumulator 17 nor the frequency or phase of the digital oscillating signal output from the phase accumulator 17 changes. This state is the locked state. When a rising edge of the reference clock signal is earlier than the lock point, the value stored in the D flip-flop 36, i.e., the output of the digital phase detector 15, is a negative value. In this case, adjustment may be made to increase the frequency of the digital oscillating signal output from the phase accumulator 17 to advance its phase. When a rising edge of the reference clock signal is later than the lock point, the value stored in the D flip-flop 36, i.e., the output of the digital phase detector 15, is a positive value. In this case, adjustment may be made to decrease the frequency of the digital oscillating signal output from the phase accumulator 17 to delay its phase.

Figure 6:
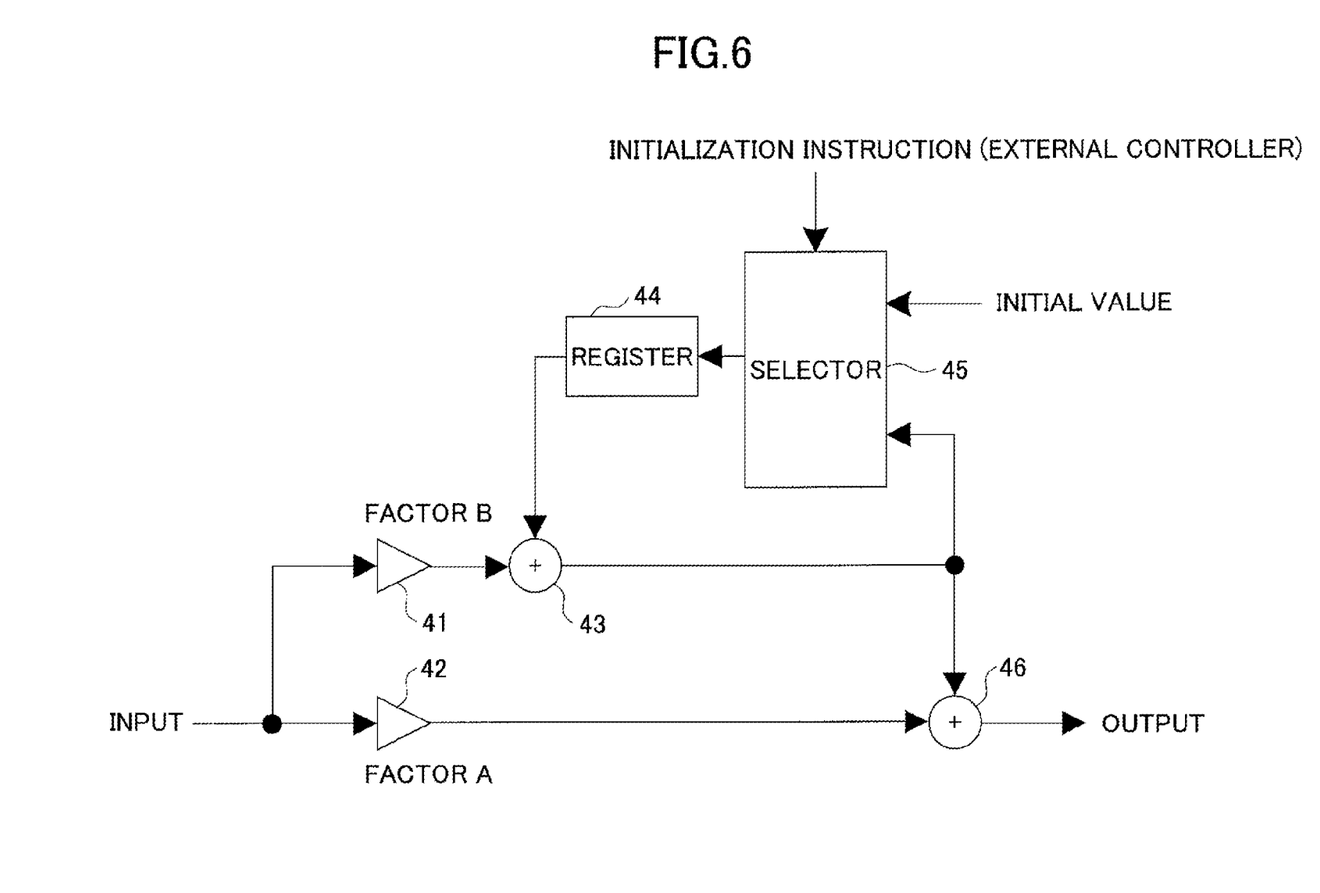
FIG. 6 is a drawing illustrating an example of the configuration of a digital loop filter.

FIG. 6 is a drawing illustrating an example of the configuration of the digital loop filter 16. The arithmetic unit 16 includes an amplifier 41, an amplifier 42, an adder 43, a register 44, a selector 45, and an adder 46. In the initial state, the selector 45 selects an initial value that is to be a center value of the oscillating frequencies of the phase accumulator 17, and supplies the initial value to the register 44. The register 44 stores the initial value supplied from the selector 45, and supplies the stored value to the adder 43.

The detected phase difference output from the digital phase detector 15 is supplied to the digital loop filter 16 as an input. This input is supplied to the amplifier 41 and to the amplifier 42 The amplifier 41 multiplies the phase difference output from the digital phase detector 15 by a predetermined factor B, and supplies B times the phase difference to the adder 43. The amplifier 42 multiplies the phase difference output from the digital phase detector 15 by a predetermined factor A, and supplies A times the phase difference to the adder 46.

The adder 43 adds the value stored in the register 44 to B times the phase difference, and supplies the result of addition to the selector 45 and the adder 46. The selector 45 selects the output of the adder 43 anytime after the initial state, and supplies the selected output to the register 44. As a result, the register 44 stores the integrated value of phase differences that is obtained by successively adding B times a phase difference to the initial value. The adder 46 adds A times the phase difference to the output of the adder 43 (i.e., the sum of the value stored in the register 44 and B times the phase difference). The sum output from the adder 46 is used as the current output of the digital loop filter 16.

Figure 7:
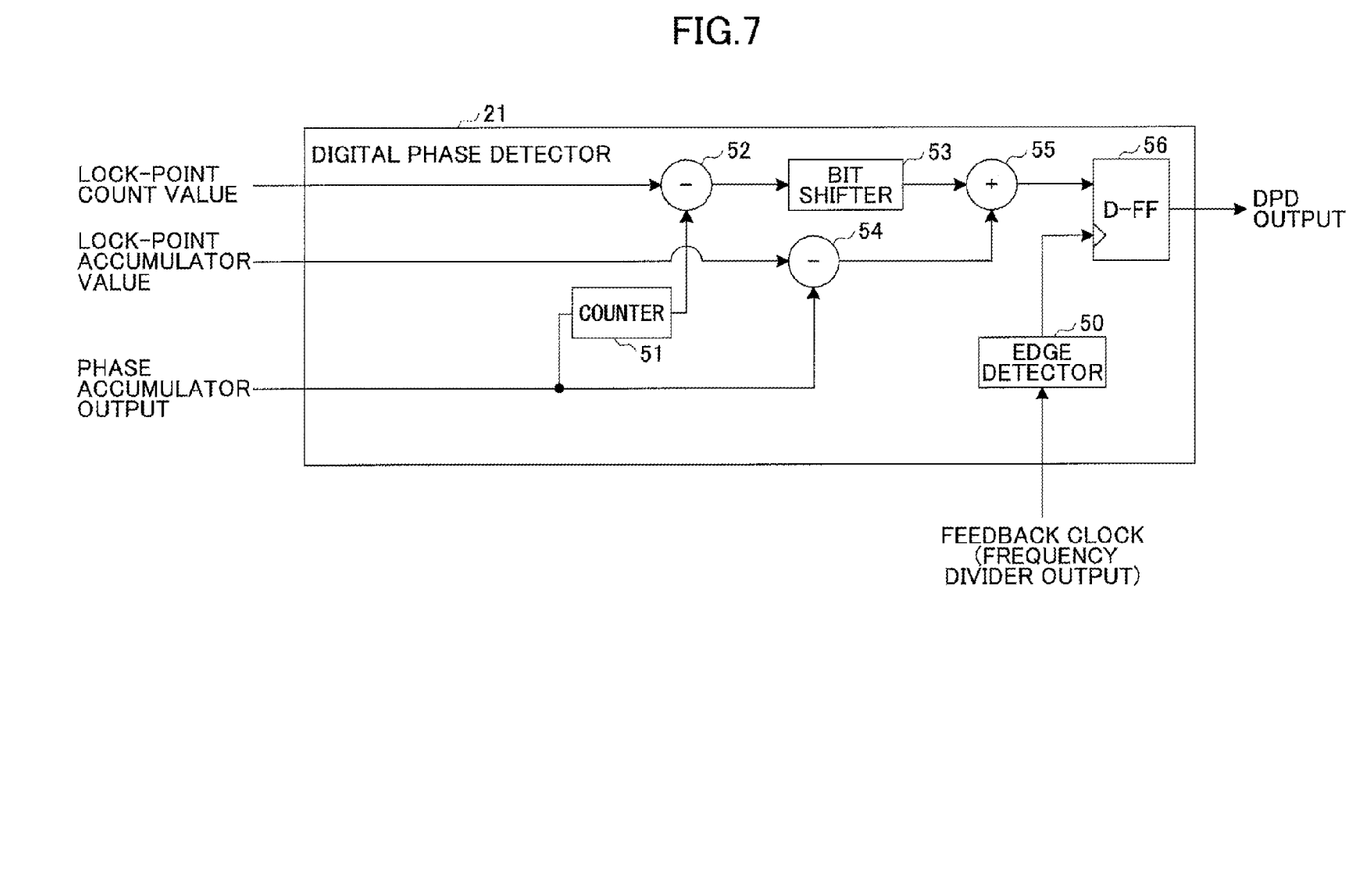
FIG. 7 is a drawing illustrating an example of the configuration of a digital phase detector.

FIG. 7 is a drawing illustrating an example of the configuration of the digital phase detector 21. The digital phase detector 21 illustrated in FIG. 7 includes an edge detector 50, a counter 51, a subtracter 52, a bit shifter 53, a subtracter 54, an adder 55, and a D flip-flop 56. The counter 51, the subtracter 52, the bit shifter 53, the subtracter 54, and the adder 55 together serve as an arithmetic unit, which calculates a value indicative of the phase position of an output of the phase accumulator 17 in response to the output value of the phase accumulator 17. Specifically, this arithmetic unit calculates a value that has, in its higher order bits, a value responsive to the value that increases with each cycle of the digital oscillating signal output from the phase accumulator 17, and has, in its lower order bits, a value responsive to the digital value of the digital oscillating signal. The D flip-flop 56 serves as a latch circuit, and stores the above-noted calculated value in synchronization with the feedback clock signal (i.e., a clock signal obtained by the frequency divider 25 dividing the frequency of the output of the voltage controlled oscillator 24).

Figure 8:
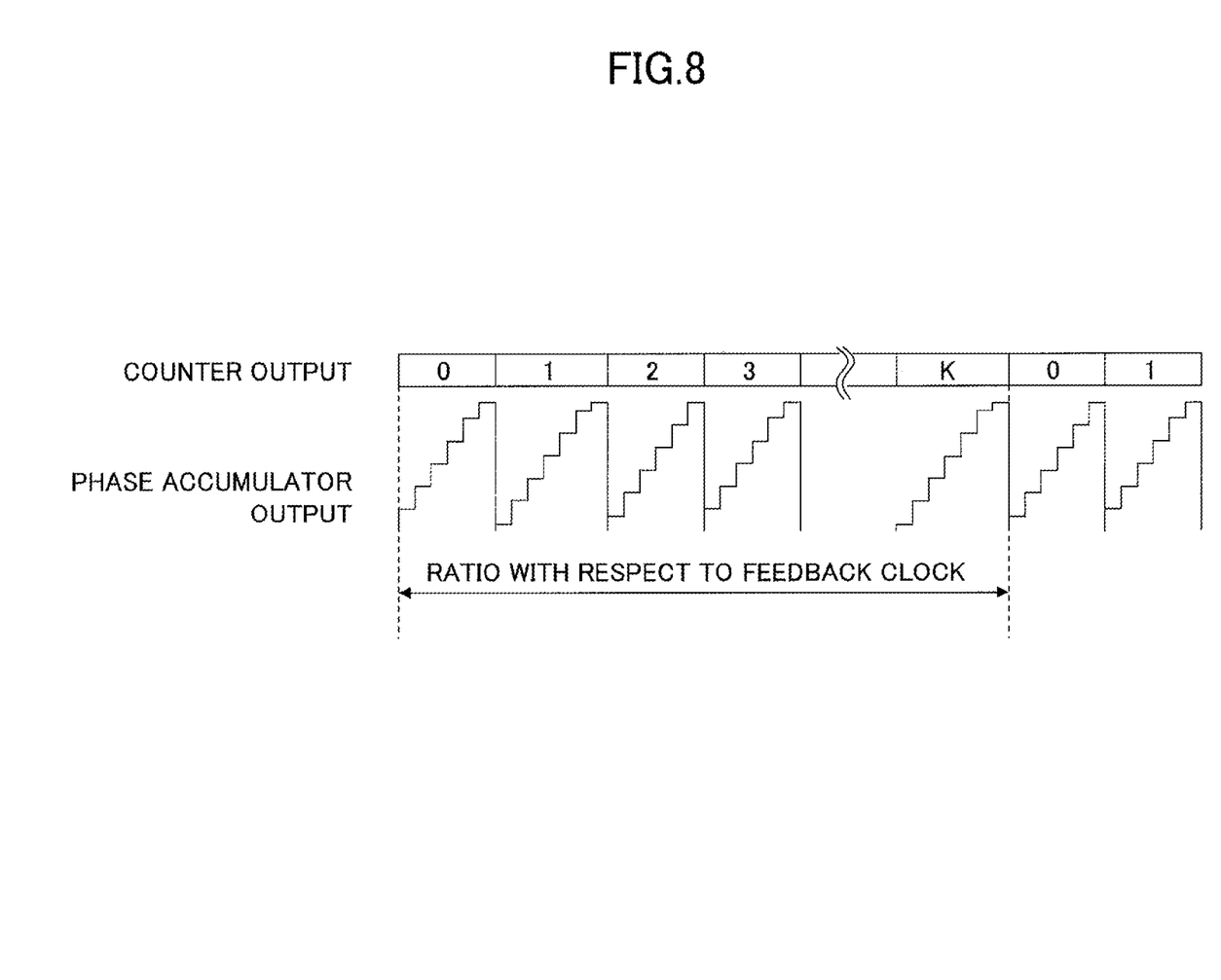
FIG. 8 is a drawing illustrating an example of the operation of a counter.

FIG. 8 is a drawing illustrating an example of the operation of the counter 51. The counter 51 counts up each time the output value of the phase accumulator 17 decreases, and is reset to zero in the cycle immediately following the cycle in which the count becomes a predetermined value K. This predetermined value K is equal to a value indicating the ratio of the digital oscillating signal output from the phase accumulator 17 to the feedback clock. As illustrated in FIG. 7, each time the output value of the phase accumulator 17 decreases upon exceeding the maximum value ($2^N-1$), the output count value of the counter 51 increases by one. In this manner, the counter 51 generates a value that increases by one with each cycle of the digital oscillating signal output from the phase accumulator 17.

Referring to FIG. 7 again, the subtracter subtracts a lock-point count value (referred to as a first predetermined value) from the output of the counter 51. The bit shifter 53 shifts to the left by N bits the value that is obtained by subtracting the lock-point count value from the output of the counter 51. A value obtained in this manner serves as the higher-order bits of the calculated value previously described. The subtracter 54 subtracts a lock-point accumulator value (referred to as a second predetermined value) from the digital oscillating signal output from the phase accumulator 17. A value obtained by the subtracter 54 serves as the lower-order bits (i.e., the N lower-order bits) of the calculated value previously described. The adder 55 adds the higher-order bits to the lower-order bits to obtain the above-noted calculated value. The edge detector 50 asserts its output upon detecting a rising edge of the feedback clock signal. The D flip-flop 56 stores the calculated value from the adder 55 in response to the assertion of the output of the edge detector 50. Namely, the D flip-flop 56 loads the calculated value from the adder 55 in response to a rising edge of the feedback clock signal. The value stored in the D flip-flop 56 serves as the output of the digital phase detector 21 (i.e., DPD output).

The higher-order bits of the above-noted calculated value indicate the cycle position (i.e., which cycle) of the output of the phase accumulator 17. The lower-order bits of the calculated value indicate the sample position of the output of the phase accumulator 17 within a given cycle. The calculated value stored in the D flip-flop 56 is a digital value that indicates the relative position of the feedback clock with respect to the output of the phase accumulator 17. It may be noted that a lock point indicates the point at which a rising edge of a pulse of the feedback clock signal is locked. When the lock-point count value is 300, for example, all the higher-order bits of the calculated value, i.e., the output value of the subtracter 52, become zero at the cycle position at which the output value of the counter 51 is 300. Further, all the lower-order bits of the calculated value become zero at some sample point within this cycle. The sample point at which all the higher-order bits and all the lower order bits of the calculated value become zero is the lock point. The calculated value changes from a negative value to a positive value upon crossing this lock point.

When a rising edge of the feedback clock signal coincides with the lock point, the value stored in the D flip-flop 56, i.e., the output of the digital phase detector 21, is zero. In such a case, the output of the digital loop filter 22 illustrated in FIG. 1 does not change. Further, neither the input of the voltage controlled oscillator 24 nor the frequency or phase of the analog oscillating signal output from the voltage controlled oscillator 24 changes. This state is the locked state. When a rising edge of the feedback clock signal is earlier than the lock point, the value stored in the D flip-flop 56, i.e., the output of the digital phase detector 15, is a negative value. In this case, adjustment may be made to increase the frequency of the analog oscillating signal output from the voltage controlled oscillator to advance its phase. When a rising edge of the feedback clock signal is later than the lock point, the value stored in the D flip-flop 56, i.e., the output of the digital phase detector 15, is a positive value. In this case, adjustment may be made to decrease the frequency of the analog oscillating signal output from the voltage controlled oscillator 24 to delay its phase.

Figure 9:
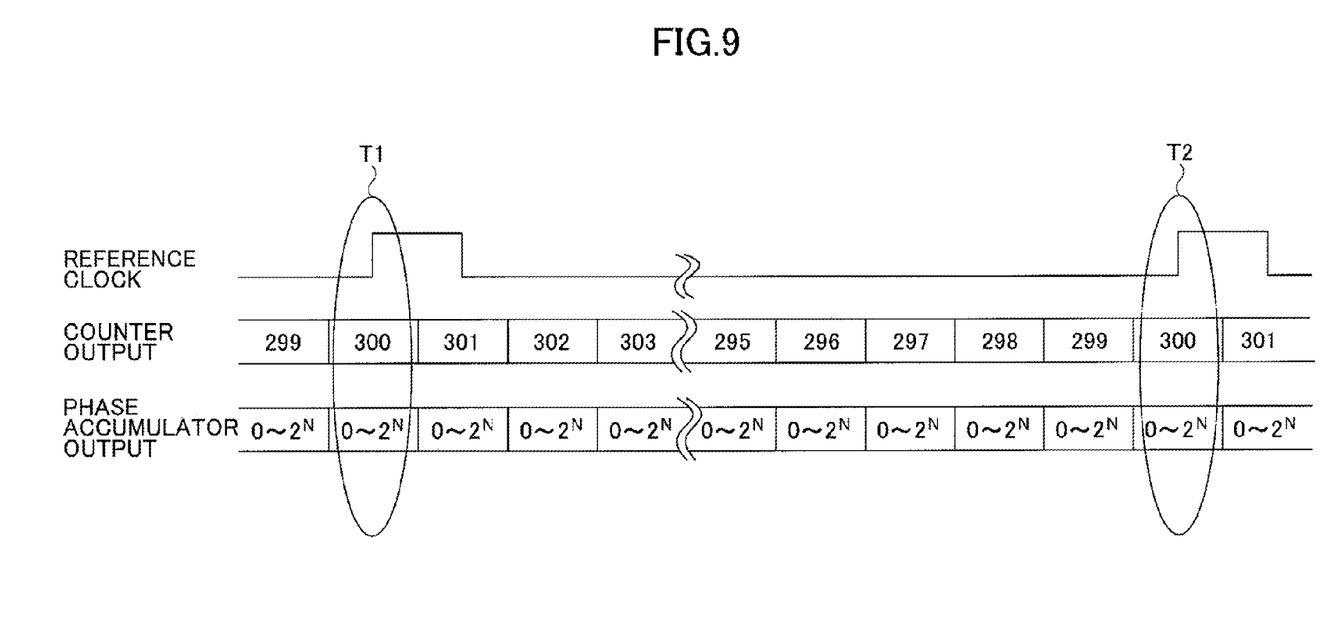
FIG. 9 is a timing chart illustrating an example of the operation of a digital PLL circuit.

FIG. 9 is a timing chart illustrating an example of the operation of the digital PLL circuit 11. At timing T1 and timing T2 indicating the positive transitions of the reference clock signal, the counter output (i.e., the output of the counter illustrated in FIG. 4) is set equal to 300. The counter output increases in increments of 1. A single counter value corresponds to one cycle of the output of the phase accumulator 17. The output of the phase accumulator 17 increases from approximately 0 to approximately $2^N$ in each cycle.

Figure 10:
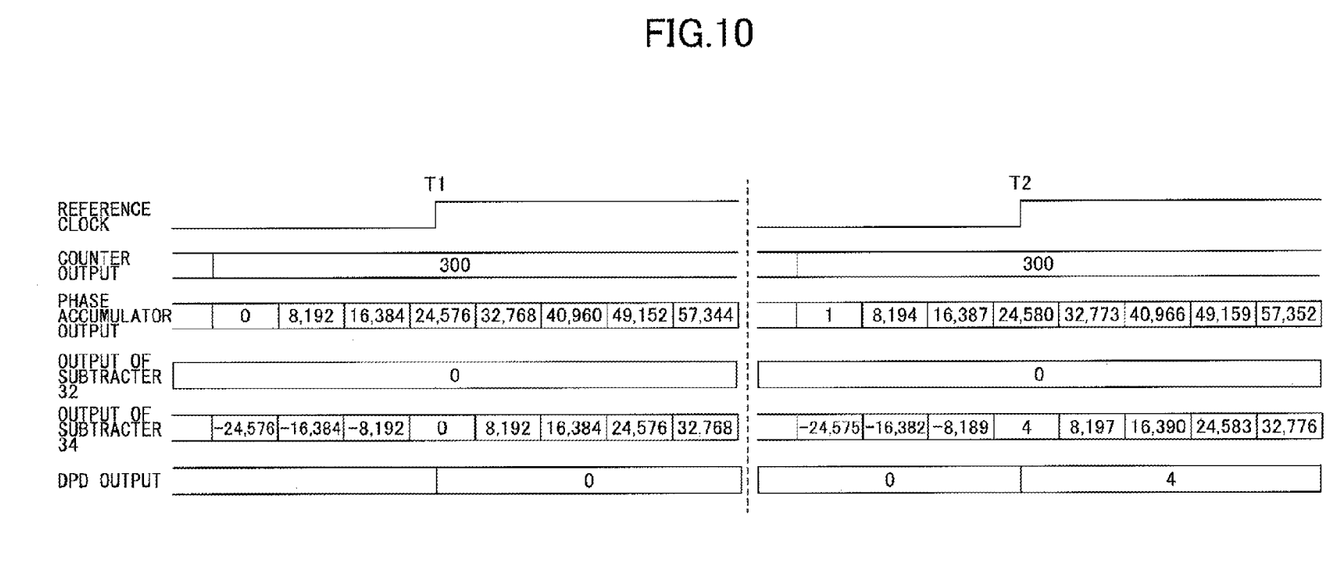
FIG. 10 is a timing chart illustrating the proximity of timing T1 and T2 illustrated in FIG. 9 in an enlarged view.

FIG. 10 is a timing chart illustrating the proximity of the timing T1 and T2 illustrated in FIG. 9 in an enlarged view. In this example, the bit width N of the output of the phase accumulator 17 is 16, and the lock-point count value is 300, with the lock-point accumulator value being 24,576. The output of the phase accumulator 17 increases by a step of 8,192 around the timing T1, and increases by a step of 8,193 around the timing T2. Since the lock-point count value is 300, the output of the subtracter 32, i.e., the value of the higher-order bits of the calculated value, is set equal to 0 at the cycle corresponding to the timing T1. Since the lock-point accumulator value is 24,576, the output of the subtracter 34, i.e., the value of the lower-order bits of the calculated value, is set equal to 0 at the sample point corresponding to the timing T1. The calculated value at this timing T1 is latched and used as the output of the digital phase detector 15 (i.e., the DPD output), so that the DPD output value is 0 after the timing T1. In the cycle corresponding to the timing T2, the output of the subtracter 32, i.e., the value of the higher-order bits of the calculated value is 0, and the output of the subtracter 34, i.e., the value of the lower-order bits of the calculated value, is 4. The calculated value at this timing T2 is latched and used as the output of the digital phase detector 15 (i.e., the DPD output), so that the DPD output value is 4 after the timing T2.

Figure 11:
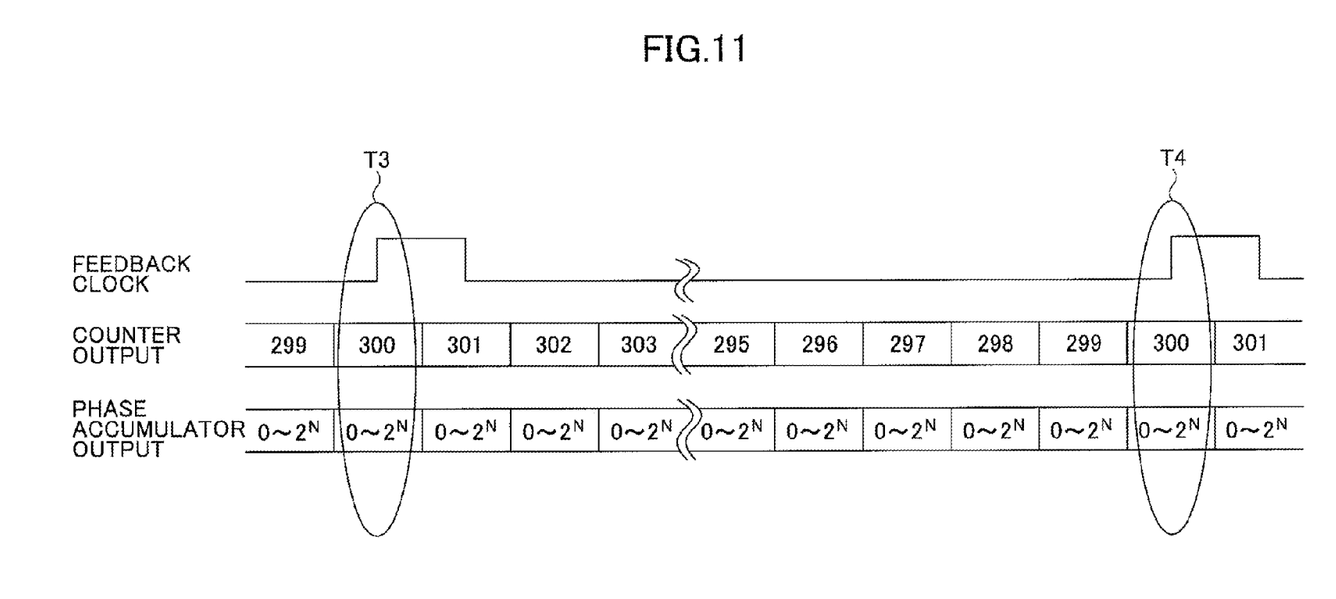
FIG. 11 is a timing chart illustrating an example of the operation of an analog PLL circuit.

FIG. 11 is a timing chart illustrating an example of the operation of the analog PLL circuit 12. At timing T3 and timing T4 indicating the positive transitions of the feedback clock signal, the counter output (i.e., the output of the counter 51 illustrated in FIG. 7) is set equal to 300. The counter output increases in increments of 1. A single counter value corresponds to one cycle of the output of the phase accumulator 17. The output of the phase accumulator 17 increases from approximately 0 to approximately $2^N$ in each cycle.

Figure 12:
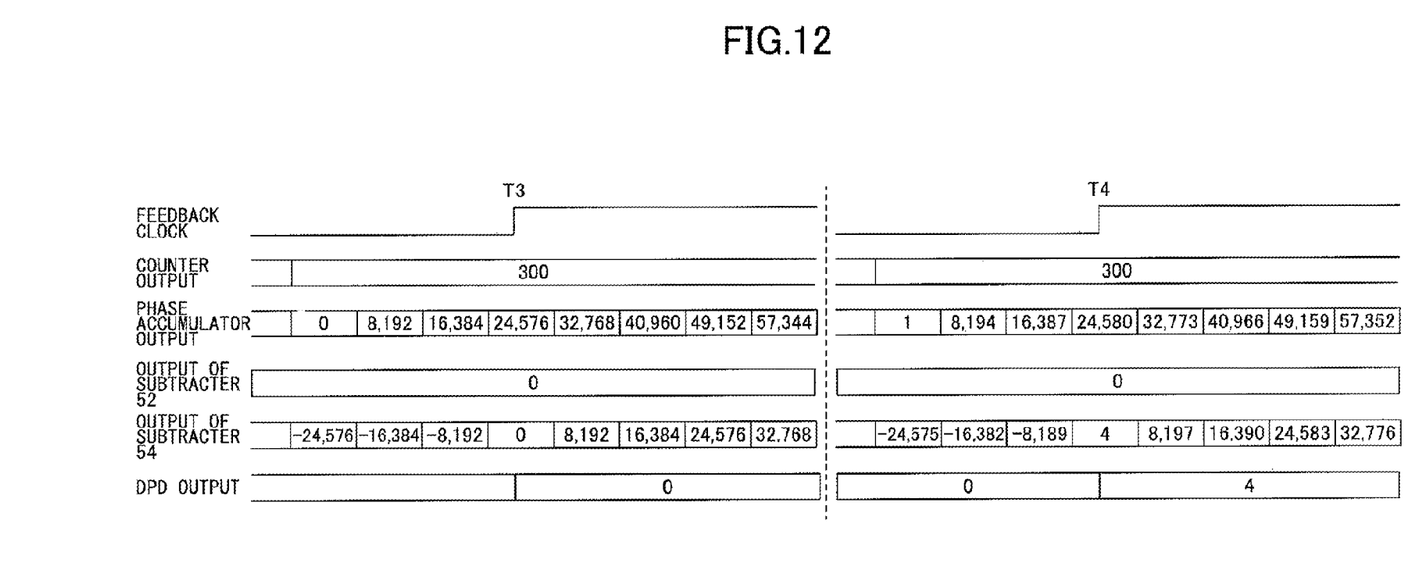
FIG. 12 is a timing chart illustrating the proximity of timing T3 and T4 illustrated in FIG. 11 in an enlarged view.

FIG. 12 is a timing chart illustrating the proximity of the timing T3 and T4 illustrated in FIG. 11 in an enlarged view. In this example, the bit width N of the output of the phase accumulator 17 is 16, and the lock-point count value is 300, with the lock-point accumulator value being 24,576. The output of the phase accumulator 17 increases by a step of 8,192 around the timing T3, and increases by a step of 8,193 around the timing T4. Since the lock-point count value is 300, the output of the subtracter 52, i.e., the value of the higher-order bits of the calculated value, is set equal to 0 at the cycle corresponding to the timing T3. Since the lock-point accumulator value is 24,576, the output of the subtracter 54, i.e., the value of the lower-order bits of the calculated value, is set equal to 0 at the sample point corresponding to the timing T3. The calculated value at this timing T3 is latched and used as the output of the digital phase detector 21 (i.e., the DPD output), so that the DPD output value is 0 after the timing T3. In the cycle corresponding to the timing T4, the output of the subtracter 52, i.e., the value of the higher-order bits of the calculated value is 0, and the output of the subtracter 54, i.e., the value of the lower-order bits of the calculated value, is 4. The calculated value at this timing T4 is latched and used as the output of the digital phase detector 21 (i.e., the DPD output), so that the DPD output value is 4 after the timing T4.

In the two-stage PLL circuit described in these embodiments, a waveform table and a DA converter are not needed in the first-stage digital PLL circuit. Further, the DA converter used in the analog PLL circuit is not required to have high phase accuracy, and suffices even if the bit width is narrow. Accordingly, a sufficiently accurate two-stage PLL circuit can be implemented by use of a simple configuration at low cost.

In a two-stage PLL circuit, generally, the cut-off frequency (i.e., loop bandwidth) of the first-stage PLL circuit is set sufficiently low for the purpose of sufficiently cutting noise entering from an external source. The low cut-off frequency means a slow loop feedback. It follows that when a DA converter provided in the first-stage PLL circuit has low resolution (i.e., low accuracy), the output of the first-stage PLL circuit slowly fluctuates with large amplitude. Such fluctuation is input into the second-stage PLL circuit, resulting in a large jitter appearing in the output clock signal. To avoid such a result, it may be desirable to provide high accuracy for and to diligently control the output of the first-stage PLL circuit. In the two-stage PLL circuit described in the embodiments, the output of the phase accumulator provided in the first-stage PLL circuit is supplied, without any change, to the second-stage PLL circuit. With this arrangement, a highly accurate clock signal can be supplied to the second-stage PLL circuit without using a highly accurate, expensive DA converter.

Further, the second-stage PLL circuit is required to have a high cut-off frequency in order to closely follow the operation of the first-stage PLL circuit. In such a case, the output fluctuates in short cycles due to the fast loop feedback. When attention is focused on an average frequency over a sufficiently long interval, almost no fluctuation is observed. Accordingly, the DA converter used in the second-stage PLL circuit is allowed to have low resolution, without giving rise to any problem.

Further, in the two-stage PLL circuit described in the embodiments, all the signal processing that requires high phase resolution can be performed as digital signal processing. Accordingly, it suffices for the analog signal processing section to have frequency stability rather than high accuracy.

According to at least one embodiment, a highly accurate frequency multiplier circuit is provided at low cost.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A PLL circuit, comprising:
   a digital PLL circuit; and
   an analog PLL circuit,
   wherein the digital PLL circuit includes:
   a first digital phase detector configured to detect a first phase difference between a reference clock signal and a first feedback clock signal; and a phase accumulator configured to generate, as the first feedback clock signal, a digital oscillating signal having oscillating frequency that changes in response to the detected first phase difference, and wherein the analog PLL circuit includes:
- a second digital phase detector configured to detect a second phase difference between the digital oscillating signal generated by the phase accumulator and a second feedback clock signal; and
- a voltage controlled oscillator configured to receive a voltage value changing in response to the detected second phase difference and to generate the second feedback clock signal that oscillates at frequency responsive to the voltage value.

2. The PLL circuit as claimed in claim 1, wherein each of the first digital phase detector and the second digital phase detector includes:
- an arithmetic unit configured to calculate a value that has, in higher order bits thereof, a value responsive to a value that increases with each cycle of the digital oscillating signal, and that has, in lower order bits thereof, a value responsive to a digital value of the digital oscillating signal; and
- a latch circuit configured to store the calculated value in synchronization with the reference clock signal or the second feedback clock signal, wherein the calculated value stored in the latch circuit is output as the first phase difference or the second phase difference.

3. The PLL circuit as claimed in claim 2, wherein the arithmetic unit obtains the higher order bits by shifting to left a value obtained by subtracting a first predetermined value from a value that increases by one with each cycle of the digital oscillating signal, and obtains the lower order bits by subtracting a second predetermined value from the digital value of the digital oscillating signal.

4. The PLL circuit as claimed in claim 2, wherein the analog PLL circuit further includes a DA converter that converts a value responsive to the detected second phase difference into an analog voltage.

5. A method of controlling a two-stage PLL circuit in which an output of a digital PLL circuit is applied as an input to an analog PLL circuit, comprising the steps of:
- utilizing a phase accumulator to generate a digital oscillating signal having oscillating frequency that changes in response to a phase difference detected by phase detection performed in the digital PLL circuit;
- utilizing the digital oscillating signal generated by the phase accumulator as a feedback clock signal used in the phase detection performed in the digital PLL circuit; and
- utilizing the digital oscillating signal generated by the phase accumulator as a reference clock signal used in phase detection performed in the analog PLL circuit.

6. A digital circuit, comprising:
- a digital PLL circuit; and
- a digital phase detector provided in a next-stage PLL circuit situated at a stage following the digital PLL circuit, wherein the digital PLL circuit includes a phase accumulator to generate a digital oscillating signal having oscillating frequency that changes in response to a phase difference detected by phase detection, and wherein the digital PLL circuit utilizes the digital oscillating signal generated by the phase accumulator as a feedback clock signal used in the phase detection performed in the digital PLL circuit, and also utilizes the digital oscillating signal generated by the phase accumulator as a reference clock signal used in phase detection performed by the digital phase detector.

7. The digital circuit as claimed in claim 6, wherein the digital phase detector includes:
- an arithmetic unit configured to calculate a value that has, in higher order bits thereof, a value responsive to a value that increases with each cycle of the digital oscillating signal, and that has, in lower order bits thereof, a value responsive to a digital value of the digital oscillating signal; and
- a latch circuit configured to store the calculated value in synchronization with a feedback clock signal of the next-stage PLL circuit, wherein the calculated value stored in the latch circuit is output as a phase detection result.

* * * * *